(12) United States Patent
Lee et al.

(10) Patent No.: US 6,350,642 B1
(45) Date of Patent: Feb. 26, 2002

(54) METHOD OF MANUFACTURING SEMICONDUCTOR MEMORY DEVICE INCLUDING VARIOUS CONTACT STUDS

(75) Inventors: Sung-choon Lee; Gyung-jin Min, both of Seoul; Jeong-sic Jeon, Kyungki-do; Kyoung-sub Shin, Sungnam, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/885,622

(22) Filed: Jun. 20, 2001

(30) Foreign Application Priority Data

Nov. 21, 2000 (KR) ........................................ 2000-69287

(51) Int. Cl.[7] ........................................... H01L 21/8242
(52) U.S. Cl. ........................................ 438/238; 438/253
(58) Field of Search ................................. 438/238–240, 438/253–256, 381, 396–399

(56) References Cited

U.S. PATENT DOCUMENTS 6,077,742 A * 6/2000 Chen et al. ................ 438/255
6,184,081 B1 * 2/2001 Jeng et al. ................. 438/253

* cited by examiner

Primary Examiner—Jey Tsai
(74) Attorney, Agent, or Firm—Mills & Onello LLP

(57) ABSTRACT

A method of manufacturing a semiconductor device including various contact studs is provided. According to the method, a plurality of contact holes for various metal contact studs aligned to a bit line, a gate, a semiconductor substrate, or an electrode are formed simultaneously after a capacitor formation process. In this case, an etch stop pattern provided for stopping a selective etching process for forming the contact holes covers the bit line or conductive plugs formed on the semiconductor substrate. The thickness of a first etch stop pattern formed on the bit line or an electrode is similar or substantially the same as a second etch stop pattern formed on conductive plugs. To this end, the method involves selectively removing a capping insulating layer on the bit line for a self aligned contact (SAC) process for forming a conductive pad connected to a capacitor and then depositing a separate etch stop layer. Alternatively, the method may involve reducing the thickness of the capping insulating layer to use it as the first etch stop pattern and forming another second etch stop pattern. In this case, a process of patterning an upper electrode of a capacitor is performed, followed by a process of etching the capping insulating layer.

20 Claims, 13 Drawing Sheets

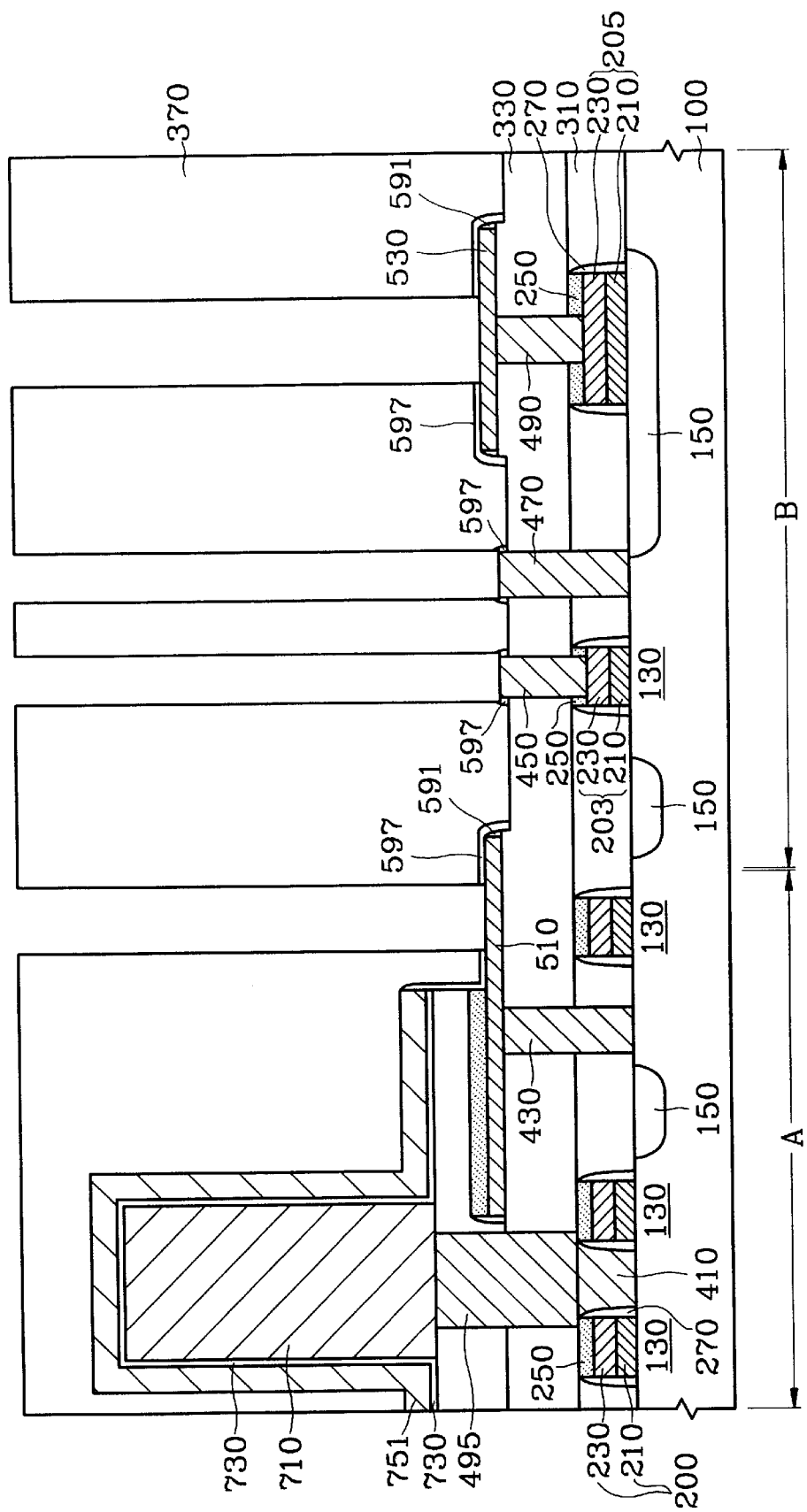

METHOD OF MANUFACTURING SEMICONDUCTOR MEMORY DEVICE INCLUDING VARIOUS CONTACT STUDS

BACKGROUND OF THE INVENTION

1. Field of the Invention

The present invention relates to a method of manufacturing a semiconductor memory device, and more particularly, to a method of manufacturing various metal contact studs suitable for various purposes simultaneously during the same fabrication step.

2. Description of the Related Art

As the integration of semiconductor devices such as dynamic random access memories (DRAMs) increases, the design rule becomes smaller and hence the margin or spatial tolerance for photolithography decreases. To alleviate problems with the reduction in design rule and photography margin, a capacitor over bit line (COB) structure and a multi-layer metallization structure have been adopted. However, since the height of a capacitor increases with the reduction in the design rule, the step difference between a region on which the capacitor is formed and a region on which the capacitor is not formed, that is, between cell and core or peripheral regions, becomes increasingly larger.

Thus, to make electrical interconnections in wiring lines formed on the uppermost surface of a semiconductor device, it is highly desirable to have a semiconductor device having metal contact studs having various heights. That is, the contact studs may be formed so as to connect with the bit line, contact or connect with an active region formed on a semiconductor substrate, or connect with the gate of a transistor. Also, the metal contact studs may be formed so as to contact or connect with a plate electrode of the capacitor.

Conventionally, to form various metal contact studs suitable for their purposes, a very complicated fabrication process is required. Furthermore, the size of each metal contact becomes significantly smaller due to the reduction in design rule, which makes the manufacturing process of the metal contact studs more difficult.

SUMMARY OF THE INVENTION

To solve the above problems, it is an object of the present invention to provide a method of manufacturing a semiconductor device including various stack studs that can overcome problems with the reduction in design rule and large step difference while simplifying the overall fabrication process.

In accordance with the invention, there is provided a method of manufacturing a semiconductor device. According to the method of the invention, a first interlayer dielectric layer which surrounds and insulates a plurality of conductive plugs is formed on a semiconductor substrate such that the top surfaces of the plurality of conductive plugs are exposed. A bit line electrically connected to a first conductive plug is formed on the first interlayer dielectric layer. The bit line includes at least one spacer on the sidewall of the spacer. A capping insulating layer is formed at one portion of the top surface of the bit line, and a first etch stop pattern having a thickness smaller than the capping insulating layer is formed at another portion of the top surface. A second etch stop pattern is formed to cover the surface of a second conductive plug. A second interlayer dielectric layer that overlies the capping insulating layer and the first and second etch stop patterns is formed. The second interlayer dielectric layer is etched using the first and second etch stop patterns as an etch stop point to form a plurality of contact holes aligned to the bit line and the second conductive plug, respectively. Portions of the first and second etch stop pattens exposed by the plurality of contact holes are etched to expose the top surfaces of the bit line and the second conductive plug. A plurality of conductive contact studs electrically connected to the bit line and the second conductive plug are formed by filling the plurality of contact holes.

In one embodiment, the second conductive plug is electrically connected to the semiconductor substrate. Alternatively, the second conductive plug can be electrically connected to a gate formed on the semiconductor substrate.

In one embodiment, while the bit line is formed, an electrode connected to a third conductive plug of the plurality of conductive plugs is also formed. A third etch stop pattern can be formed on the top surface of the electrode, and a spacer can be formed along a sidewall of the electrode.

The first etch stop pattern can be formed of at least one of silicon nitride, silicon carbide and aluminum oxide. The second etch stop pattern can also be formed of at least one of silicon nitride, silicon carbide and aluminum oxide. In one embodiment, the difference in thickness between the first and second etch stop patterns is less than 100 Å.

The first etch stop pattern can be formed by forming the capping insulating layer extending to a portion where the first etch stop pattern is positioned and by selectively etching the capping insulating layer and reducing its thickness. The method can also include forming a third interlayer dielectric layer overlying the capping insulating layer under the second interlayer dielectric layer. A lower electrode of a capacitor, a dielectric layer and an upper electrode layer can be formed on the third interlayer dielectric layer to underlie the second interlayer dielectric layer. The upper electrode layer can be patterned to form an upper electrode. The first etch stop pattern is formed by etching the third interlayer dielectric layer exposed after having patterned the upper electrode layer and by etching a portion of the capping insulating layer exposed by etching the third interlayer dielectric layer. The second etch stop pattern can be formed by patterning a spacer layer deposited on the bit line to form the spacer.

In one embodiment, the first and second etch stop patterns are formed by selectively removing the portion of the capping insulating layer overlying the portion where the first etch stop pattern will be formed and selectively exposing the top surface of the bit line while exposing the top surface of the second conductive plug. An etch stop layer is formed overlying the exposed top surfaces of the bit line and the second conductive plug, and the etch stop layer is patterned. In one more particular embodiment, a third interlayer dielectric layer is formed overlying the capping insulating layer under the second interlayer dielectric layer. A lower electrode of a capacitor, a dielectric layer and an upper electrode layer are formed on the third interlayer dielectric to underlie the second interlayer dielectric layer. The upper electrode layer is patterned to form an upper electrode. To expose the top surface of the second interlayer dielectric layer, the second interlayer dielectric layer is continuously etched after patterning the upper electrode layer. A portion of the capping insulating layer exposed by etching the third interlayer dielectric layer is etched to expose the top surface of th underlying bit line. The third interlayer insulating layer is continuously etched using the exposed bit line as an etch mask.

The present invention can prevent the occurrences of a defective profile such as the excessive loss of an interlayer dielectric layer, which underlies the contact hole, while simultaneously forming metal contact studs electrically connected to the bit line, the semiconductor substrate, or the gate.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 10–13 are cross-sectional views schematically showing a method of manufacturing a semiconductor device according to a second embodiment of the present invention.

DETAILED DESCRIPTION OF THE INVENTION

Figure 1:
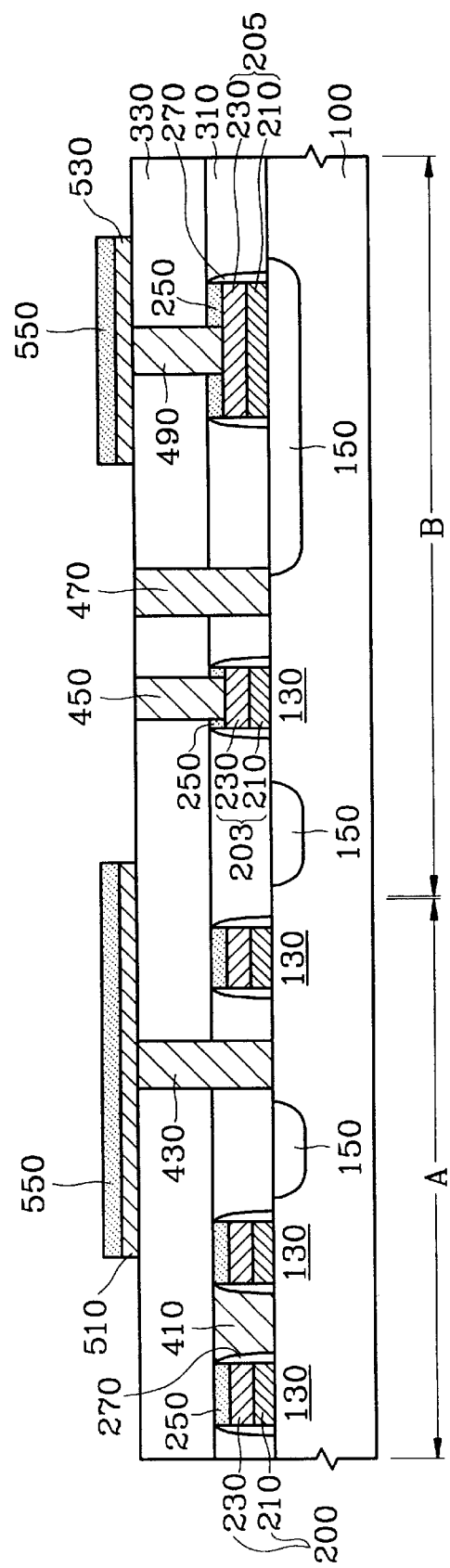
FIGS. 1–9 are cross-sectional views schematically showing a method of manufacturing a semiconductor device according to a first embodiment of the present invention.

The present invention will now be described more fully with reference to the accompanying drawings, in which preferred embodiments of the present invention are shown. This invention may, however, be embodied in many different forms and should not be construed as being limited to the embodiments set forth herein. In the drawings, the shape of elements is exaggerated for clarity. Further, it will be understood that when a layer is referred to as being "on" another layer or substrate, it can be directly on the other layer or substrate, or intervening layers may also be present.

An embodiment of the present invention includes a method of concurrently forming a plurality of contact holes for metal contact studs aligned to a bit line, a gate, a semiconductor substrate, or an electrode following the step of forming a capacitor. An etch stop pattern for stopping a selective etching process for forming the contact holes is provided so as to shield the bit line or conductive plugs formed on the semiconductor substrate.

The etch stop pattern on the bit line may be formed by reducing the thickness of a capping insulating layer provided for a self-aligned contact (SAC) etching process over the bit line. Further, the etch stop pattern may be formed by partially removing the capping insulating layer provided over the bit line and then depositing and patterning an etch stop layer. The etch stop pattern provided on the conductive plug may be formed by patterning the etch stop layer or during a step of forming a spacer which is provided for a SAC etching process and shields the sidewall of the bit line. The present invention involves performing the step of removing the capping insulating layer or reducing the thickness thereof followed by an etching process for patterning an upper electrode of the capacitor formed over the bit line.

FIG. 1 schematically shows the step of forming a bit line 510 on a semiconductor substrate 100. More specifically, multi-layered conductive patterns 210 and 230 and a plurality of gates 200, 203, and 205, each of which includes the conductive patterns 210 and 230, are formed on the semiconductor substrate 100 including a cell region A and a peripheral circuit region B. The peripheral circuit region B may include a core region on the semiconductor substrate 100. In this case, a gate insulating layer (not shown) is formed at an interface between each of the gates 200, 203, and 205 and an active region 130 of the semiconductor substrate 100. Each of the gates 200, 203, and 205 is formed on the active region 130, which is defined by an isolation layer 150, to form a transistor. In this case, a plurality of first gates 200, which are positioned on the cell region A and form cell transistors, respectively, may be formed together with a second gate 203 and a third gate 205 having a larger line width than the first gates 200.

Each of the gates 200, 203, and 205 may be formed by sequentially forming a conductive silicon layer 210 and a metal silicide layer such as a tungsten silicide layer 230. A first capping insulating layer 250 is formed on top of the gate 200. In this case, the first capping insulating layer 250 is formed of an insulating material such as a silicon nitride layer having high selectivity to an insulating material layer used as an interlayer dielectric layer such as a silicon oxide layer. Also, first spacers 270 are formed at the sidewalls of the gates 200, 203, and 205. The first spacer 270 is formed of an insulating material such as silicon nitride having high selectivity to an insulating material layer used as an interlayer dielectric layer.

The reason for forming the first capping insulating layer 250 and the first spacer 270 of a silicon nitride layer is that a SAC process is employed in forming a contact hole through an interlayer dielectric layer so as to overcome the reduction in a design rule. After having formed the gates 200, 203, and 205, a first interlayer dielectric layer 310 overlies the gates 200, 203, and 205. The first interlayer dielectric layer 310 may be formed of an insulating material such as a silicon oxide layer. The first interlayer dielectric layer 310 is patterned to form a contact hole for a conductive pad 410. Then, a conductive layer for filling the contact hole is formed and then patterned using chemical mechanical polishing (CMP) to form the conductive pad 410. The conductive pad 410 is formed using a SAC process. The conductive pad 410 electrically contacts the active region 130 of the semiconductor substrate 100 and is electrically connected to a lower electrode of a capacitor to be formed in a subsequent process. That is, the conductive pad 410 is used as a buried contact (BC) pad.

Then, a second interlayer dielectric layer 330 that overlies the conductive pad 410 is formed on the first interlayer dielectric layer 310. The second interlayer dielectric layer 330 may be formed of an insulating material such as a silicon oxide layer.

The second interlayer dielectric layer 330 and the underlying first interlayer dielectric layer 310 are patterned by photolithography to form a plurality of contact holes for conductive plugs 430, 450, 470, and 490. The contact holes are formed at positions where a bit line or a wiring line will be electrically connected in a subsequent process. For example, the contact holes may be formed so as to expose the active region 130 on the cell region or the top surface of the second gate 203 located on the peripheral circuit region B, that is, the tungsten silicide layer 230. Also, the contact holes may be formed so as to expose the active region 130 on the peripheral circuit region B or the top surface of the third gate 205 on the peripheral circuit region B.

After having formed the contact holes in this way, a conductive layer for filling the contact holes is formed on the second interlayer dielectric layer 330 and then planarized by CMP to form the plurality of conductive plugs 430, 450, 470, and 490. The conductive plugs 430, 450, 470, and 490 are formed at positions well suited to various functions.

For example, a first conductive plug 430 may be formed so as to electrically connect a bit line, which will be later formed, with the active region 130 of the semiconductor substrate 100 on the cell region A for operation of a cell transistor. That is, the first conductive plug 430 may be used as a direct contact (DC) plug. A second conductive plug 450 may be formed so as to electrically connect to the second gate 203 on the peripheral circuit region B. The third conductive plug 470 may be formed so as to electrically connect to the active region 130 on the peripheral circuit region B. A fourth conductive plug 490 may be formed so as to electrically connect the third gate 205 on the peripherical region B.

The conductive plugs 430, 450, 470, and 490 may be formed of a conductive material such as Ti/TiN. Also, each of the conductive plugs 430, 450, 470, and 490 may be formed with a design rule of about 0.091 μm.

Following formation of the conductive plugs 430, 450, 470, and 490, a conductive layer is deposited over the second interlayer dielectric layer 330 and patterned to form a bit line 510. The bit line 510 may be formed of a conductive material such as tungsten. In this case, the bit line 510 may be formed with a design rule of about 0.11 μm line width. Also, the bit line may be formed with a thickness of about 1,000Å.

A barrier metal layer (not shown) may underlie the bit line 510 with a thickness of about 400 Å, and preferably, a second capping insulating layer 550 overlies the bit line 510. Preferably, the bit line 510 electrically connects with the first conductive plug 430 electrically connecting to the active region 130 on the cell region A. Also, the bit line 510 formed on the cell region A may extend to the peripheral circuit region B for connection with a wiring line, which will be later formed. Together with the bit line 510, an electrode 530 electrically connected to the third gate 205 on the peripheral circuit region B may be formed. That is, the electrode 530 electrically connected to the fourth gate 205 on the peripheral circuit region B may be formed together during a process of forming the bit line 510. That is, the conductive layer deposited for forming the bit line 510 may be patterned as the electrode 530 during a process of patterning the bit line 510.

Meanwhile, the second capping insulating layer 550 may be deposited on the conductive layer deposited for forming the bit line 510. Thus, the second capping insulating layer 550 may be formed of an insulating material such as silicon nitride having high selectivity to silicon oxide. In this case, the second capping insulating layer 550 may be formed to a thickness of about 1,000–2,000 Å.

Figure 2:
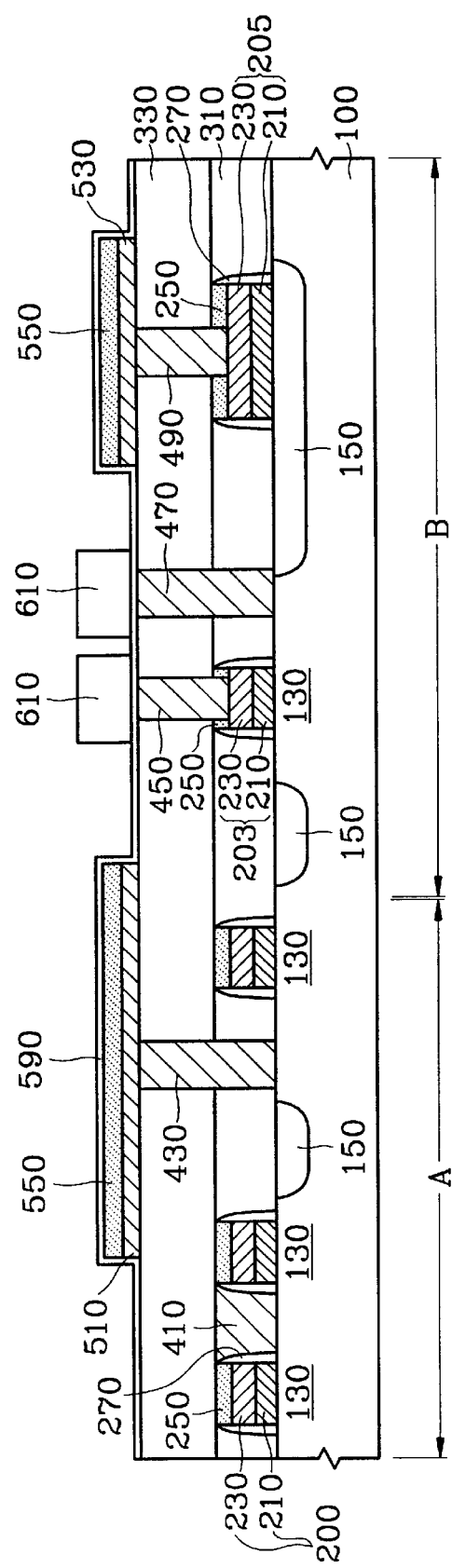

FIG. 2 schematically shows the step of forming a second spacer layer 590 on the bit line 510. More specifically, an insulating material such as silicon nitride is deposited over the resulting material, on which the bit line 510 has been formed, to form the second spacer layer 590. The second spacer layer 590 is formed so as to substantially overlie the bit line 510 or the sidewalls of the electrode 530 on the second capping insulating layer 550 and extends so as to overlie the second interlayer dielectric layer 330. Also, the second spacer layer 590 extends so as to overlie the second and third conductive plugs 450 and 470 exposed by the second interlayer dielectric layer 330.

The second spacer layer 590 is provided so as to form a second spacer substantially along the sidewalls of the bit line 510. Thus, the thickness of the second spacer layer 590 may be determined depending on the width of the second spacer to be formed at the side wall of the bit line 510. The second spacer layer 590 may be formed of a silicon nitride layer having a thickness of about 400 Å.

In the first embodiment of the present invention, in the second spacer layer 590, in particular, portions overlying the second and third conductive plugs 450 and 470, are used as an etch stop point for controlling an etching process, which will later be introduced for a subsequent process. Thus, during an etching process for forming the second spacer by etching the second spacer layer 590, it is preferable to selectively leave the portions of the second spacer layer 590 used as an etch stop point unetched. To this end, etch masks for shielding the portions of the second spacer layer 590 that overlie the second and third conductive plugs 450 and 470, respectively, such as first photoresist patterns 610, are formed on the second spacer layer 590.

Figure 3:
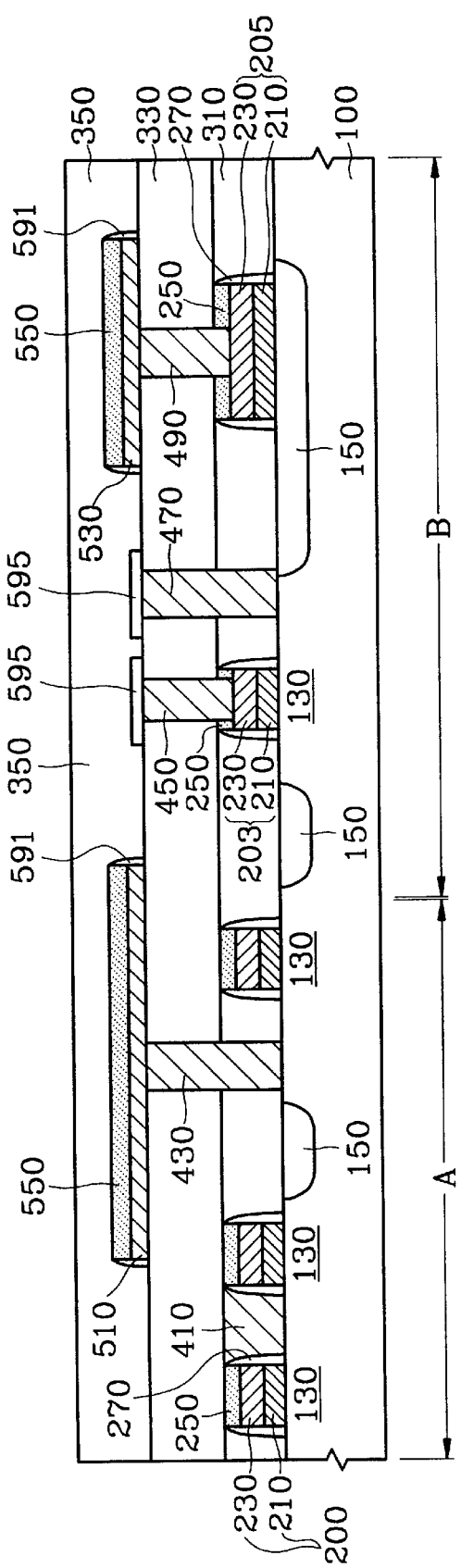

FIG. 3 schematically shows the step of forming a second spacer 591 and a first etch stop pattern 595. Specifically, the second spacer layer 590 is anisotropically etched to form the second spacer 591 along the sidewalls of the bit line 510. In this case, the second spacer 591 may be formed together at the sidewalls of the electrode 530.

Meanwhile, the portions of the second spacer layer 590 shielded by the first photoresist pattern 610 which serves as the first etch mask as shown in FIG. 2, are not anisotropically etched to remain as a pattern. As a result, the first etch stop patterns 595 that overlie the second and third conductive plugs 450 and 470 are formed. In this case, the first etch stop patterns 595 preferably have line widths sufficient to completely cover the surfaces of the second and third conductive plugs 450 and 470. Since the second spacer layer 590 remains to form the first etch stop pattens 595, the first etch stop patterns 595 may be formed with a thickness corresponding to approximately the width of the second spacer 591. For example, the first etch stop pattern 595 may be formed with a thickness of about 400 Å.

Then, a third interlayer dielectric layer 350 overlies the resulting material on which the second spacer 591 and the first etch stop pattern 595 have been formed. The third interlayer dielectric layer 350 is preferably formed of an insulating material such as silicon oxide having high selectivity to the second spacer 591 and the second capping insulating layer 550.

Figure 4:
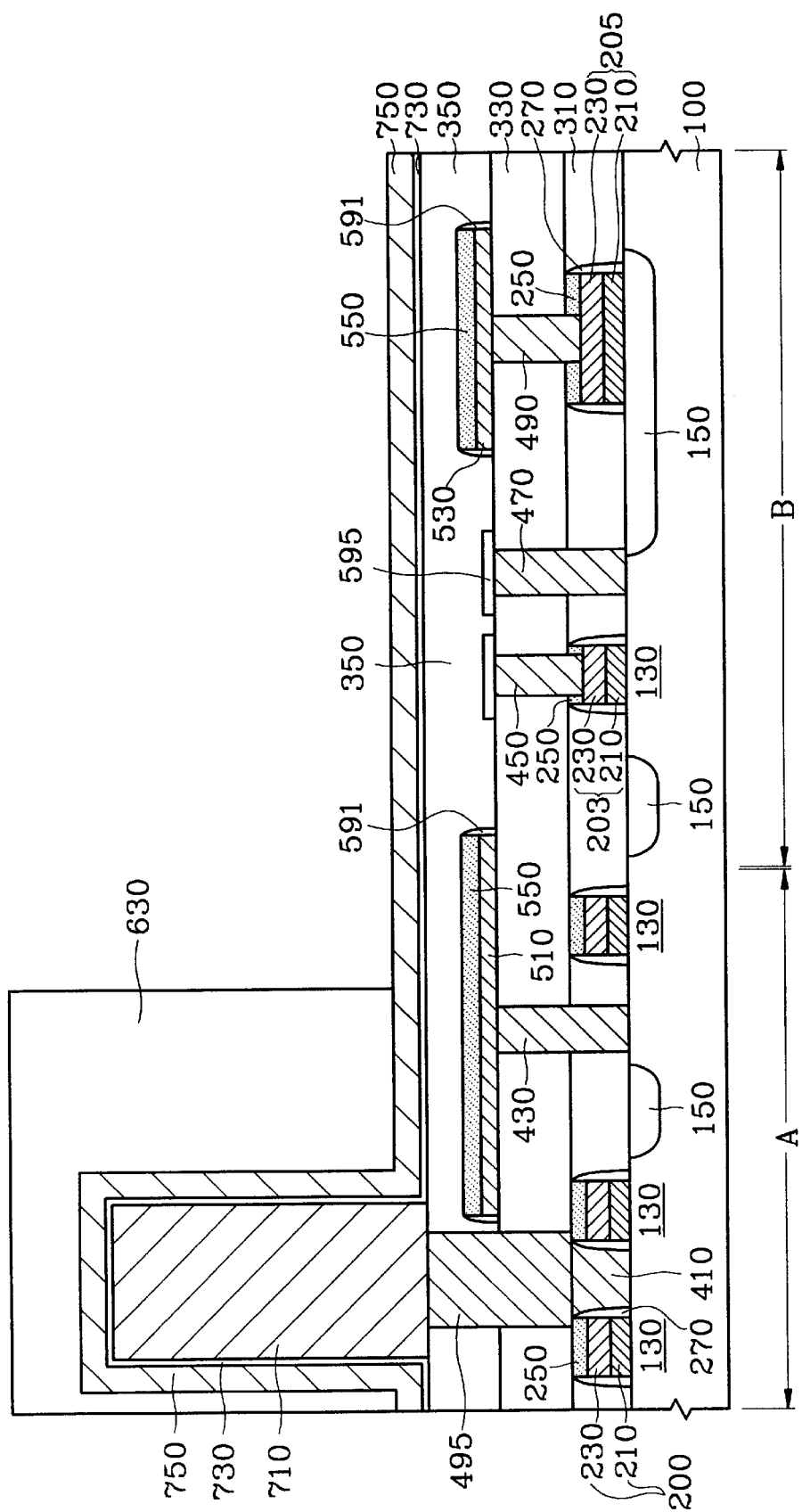

FIG. 4 schematically shows the step of forming a lower electrode 710, a dielectric layer 730, and an upper electrode layer 750 on the conductive pad 410. More specifically, the third interlayer dielectric layer 350 and the underlying second interlayer dielectric layer 330 are patterned to form a contact hole exposing the conductive pad 410, which is a BC pad. In this case, to overcome very small design rule, a SAC process is employed to form the contact hole. That is, the contact hole is formed by means of the SAC process that is able to prevent the bit line 510 from being exposed by using the second capping insulating layer 550 and the second spacer 591 formed at top of the bit line 510 and sidewall thereof.

Subsequently, a conductive layer for filling the contact hole is formed and planarized so as to expose the surface of the third interlayer dielectric layer 350 thereby forming a BC plug 495 for filling the contact hole. Then, the lower electrode 710 of a capacitor electrically connected to the BC plug 495 and the underlying cell transistor is formed of a conductive material. The lower electrode 710 may have a three-dimensional shape such as a stack shape or a cylinder shape in order to increase capacitance.

A dielectric material is deposited on the lower electrode 710 to form the dielectric layer 730, on top of which the upper electrode layer 750 is formed. The upper electrode layer 750 may be formed of various conductive materials such as a conductive polycrystalline silicon layer. Then, a second etch mask to be used in photolithography for patterning the upper electrode layer 750, such as a second photoresist pattern 630, is formed. Since the upper electrode layer 750 also extends to the semiconductor substrate 100 on the peripheral circuit region B, the second photoresist pattern 630 may expose the peripheral circuit region B so as to selectively remove a portion of the upper electrode layer 750 on the peripheral circuit region B.

Figure 5:
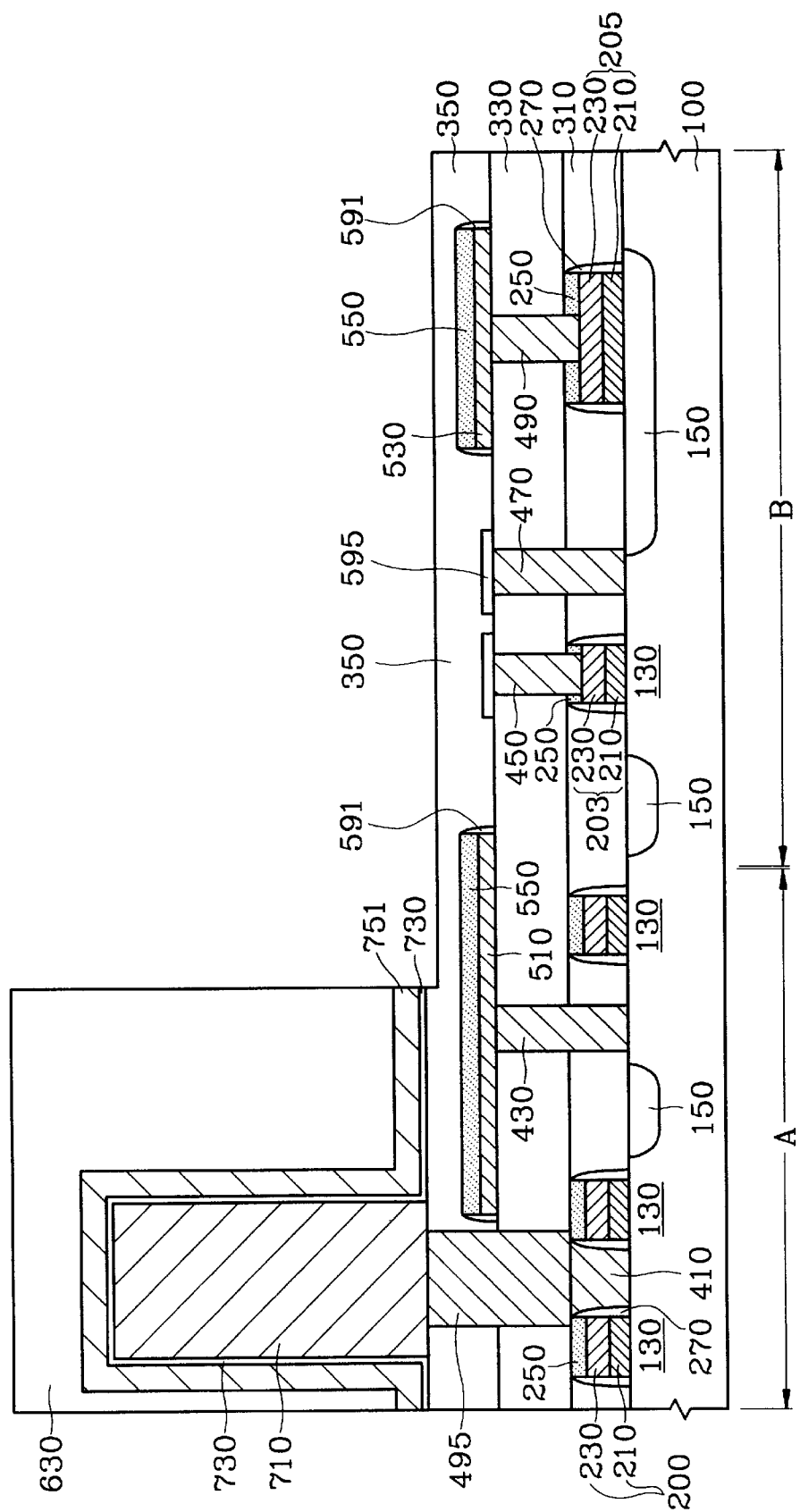

As shown in FIG. 5, the portion of the upper electrode layer 750 exposed by the second photoresist pattern 630 is selectively etched and removed, thereby forming the patterned upper electrode 751. In this case, the upper electrode 751 may be patterned with a design rule of a line width of about 0.13 μm. The dielectric layer 730 underlying the upper electrode layer 750 also may continue to be etched and then patterned. Also, a partial thickness of the underlying third interlayer dielectric layer 350 exposed by the dielectric layer 730 patterned by this etching also may be recessed.

Figure 6:
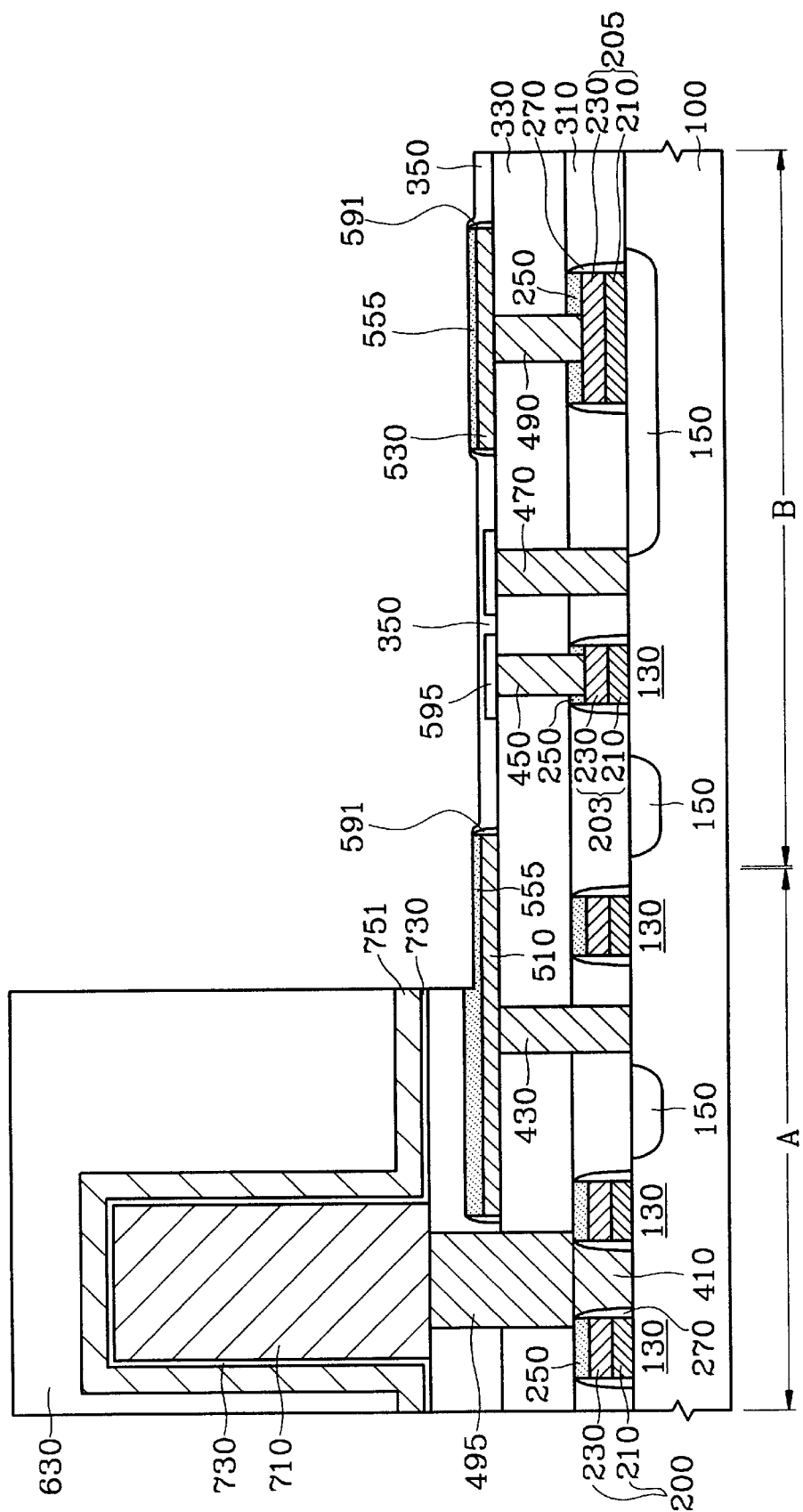

FIG. 6 schematically shows the step of making the thickness of the second capping insulating layer 550 smaller. More specifically, the upper electrode 751 is patterned as described with reference to FIG. 5 and then the exposed third interlayer dielectric layer 350 continues to be etched. In this case, the third interlayer dielectric layer 350 may continue to be etched under etching conditions different from those used in patterning the upper electrode 751. For example, the third interlayer dielectric layer 350 continues to be etched under an etching condition that the etching rate of the second capping insulating layer 550 is similar to or higher than the etching rate of the third interlayer dielectric layer 350.

Specifically, an etch gas mainly containing $CHF_3$ gas may be used in etching the upper electrode 751. In this case, $O_2$ gas, Ar gas, or $CF_4$ gas may be added to the etch gas as an additional gas. When patterning of the upper electrode 751 or the substantially dielectric layer 730 is complete, an etch gas condition may be changed.

For example, the exposed third interlayer dielectric layer 350 continues to be etched to reduce the thickness thereof by changing an etch gas condition to use an etch gas containing $CH_2F_2$ gas as a main etch gas. $O_2$ gas, Ar gas, or $CF_4$ gas may be added to the etch gas, which contains a hydrofluoro carbon gas such as $CH_2F_2$ gas as a main etch gas, as an additional gas.

During a process of etching the third interlayer dielectric layer 350, the second photoresist pattern 630 used in a process of patterning the upper electrode 751 may continue to be used as an etch mask. The etching continues to proceed after the surface of the second capping insulating layer 550 underlying the third interlayer dielectric layer 350 is exposed, thereby etching the second capping insulating layer 550 from the surface and thus reducing the thickness thereof. In this case, the etch gas which contains $CH_2F_2$ gas as a main gas as described above can implement selectivity of silicon nitride to silicon oxide as greater than 1.2.

Thus, even if the initial thickness of the second capping insulating layer 550 formed of a silicon nitride layer is reduced to less than ½, the third interlayer dielectric layer 350 overlying the first etch stop pattern 595 may be left or substantially, the first etch stop pattern 595 underlying the third interlayer dielectric layer 350 may be protected from being consumed by etching.

For example, if the thickness of the bit line 510 is about 1,000 Å and the initial thickness of the second capping insulating layer 550 is about 1,000 Å, the residual thickness of the third interlayer dielectric layer 350 overlying the first etch stop pattern 595 upon exposure of the second capping insulating layer 550 may be about 2,000 Å. When the etching continues to be performed as described to reduce the thickness of the second capping insulating layer 550 to about 500 Å, the third interlayer dielectric layer 350 having a thickness about 1,000 Å may remain on the surface of the first etch stop pattern 595 even in the case where selectivity of silicon nitride to silicon oxide is 1:2.

Thus, the first etch stop pattern 595 may be protected from loss. When the etching is terminated at this point using a time etch technique, the thickness of the exposed second capping insulating layer 550 may significantly be reduced to about 500 Å. That is, the thickness of the second capping insulating layer 550 approximates that of the first etch stop pattern 595 so that the difference is made less than 100 Å. The portion of the second capping insulating layer 550, the thickness of which has been reduced, is used as a second etch stop pattern 555.

Furthermore, even in the case where the thickness of the second etch stop pattern 555, which remains after etching of the second capping insulating layer 550, is made less than 500 Å, e.g., 300 Å, as described above, the first etch stop pattern 595 may be prevented from significantly being consumed by this etching. As described above, the reason for forming the second etch stop pattern 555 by reducing the thickness of the selectively exposed second capping insulating layer 550 while preventing the first etch stop pattern from being etched is to advantageously perform a subsequent process of simultaneously forming the contact holes for metal contact studs having various purposes.

Figure 7:
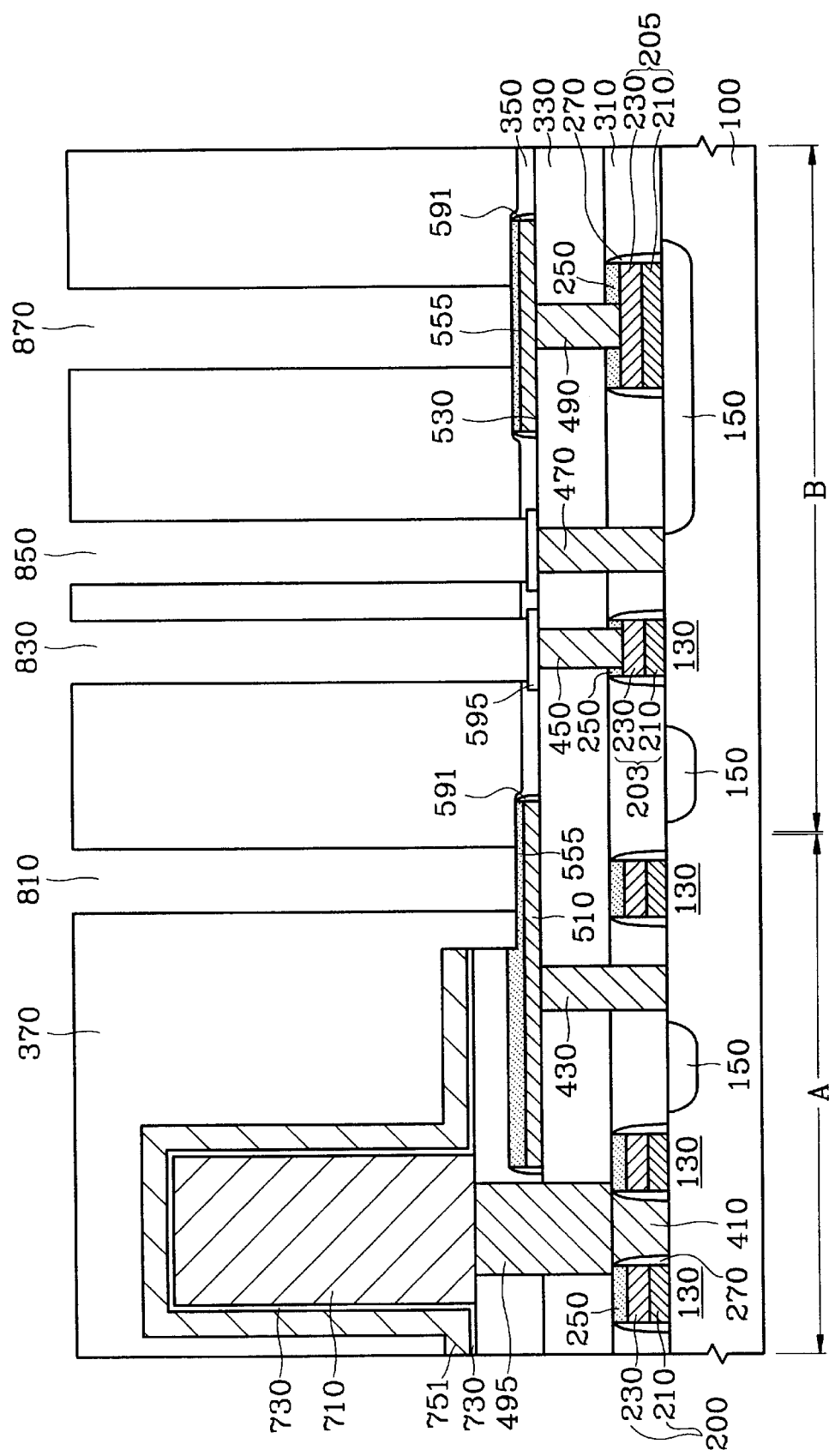

FIG. 7 schematically shows the step of forming a plurality of contact holes 810, 830, 850, and 870 for metal contact studs after forming a fourth interlayer dielectric layer 370 that overlies the upper electrode 751. More specifically, the fourth interlayer dielectric layer 370 overlies the resulting material on which the upper electrode 751 and the second etch stop pattern 555 have been formed. In this case, the fourth interlayer dielectric layer 370 is formed to a thickness sufficient to overcome the step difference between the cell region A and the peripheral circuit region B due to the height of a cell capacitor. Also, the fourth interlayer dielectric layer 370 may be formed of a silicon oxide layer. The first through fourth interlayer dielectric layers 310, 330, 350, and 370 each may have planar surfaces by performing planarization techniques such as CMP after deposition.

The fourth interlayer dielectric layer 370 is selectively etched using photolithography to form the plurality of contact holes 810, 830, 850, and 870 at various positions. For example, a first contact hole 810 aligned on a portion of the bit line 510 extending to the peripheral circuit region B may be formed. In this case, since the fourth interlayer dielectric layer 370 is preferably formed of a silicon oxide layer, the above etching process may be performed under etching conditions for silicon oxide which are known in the art. As the fourth interlayer dielectric layer 370 etches away, the exposed portion of the third interlayer dielectric layer 350, which remains on the first etch stop pattern 595, may also be selectively etched.

In this case, since the second etch stop pattern 555 is positioned on the bit line 510 as described above, an etching process for forming the first contact hole 810 may be terminated on the second etch stop pattern 555. That is, since the fourth interlayer dielectric layer 370 is preferably formed of a silicon oxide layer while the second etch stop pattern originating from the second capping insulating layer 550 is preferably formed of a silicon nitride layer, the second etch stop pattern 555 may act as an etch stop point under the conditions for etching the fourth interlayer dielectric layer 370.

Furthermore, a second contact hole 830, which is aligned on the third conductive plug 470 electrically connected to the active region 130 of the peripheral circuit region B, may be formed by etching the fourth interlayer dielectric layer 370. In this case, the etching process may be terminated by the first etch stop pattern 595 overlying the second conductive plug 450.

A third contact hole 850 which is aligned on the third conductive plug 470 electrically connected to the active region 130 of the peripheral circuit region B, may be formed by etching the fourth interlayer dielectric layer 370. In this case, the etching process may be terminated by the first etch stop pattern 595 overlying the third conductive plug 470.

Meanwhile, a fourth contact hole 870, which is aligned on the electrode 530 electrically connected to the third gate 205 on the peripheral circuit region B, may be formed by etching the fourth interlayer dielectric layer 370. In this case, the etching process may be terminated by the second etch stop pattern 555 formed on the electrode 530.

In this embodiment, the plurality of contact holes 810, 830, 850, and 870, which are aligned at different positions, may be formed by one etching process. In this case, the contact holes 810, 830, 850, and 870 are formed for metal contact studs for electrically connecting with metal wiring lines.

Figure 8:
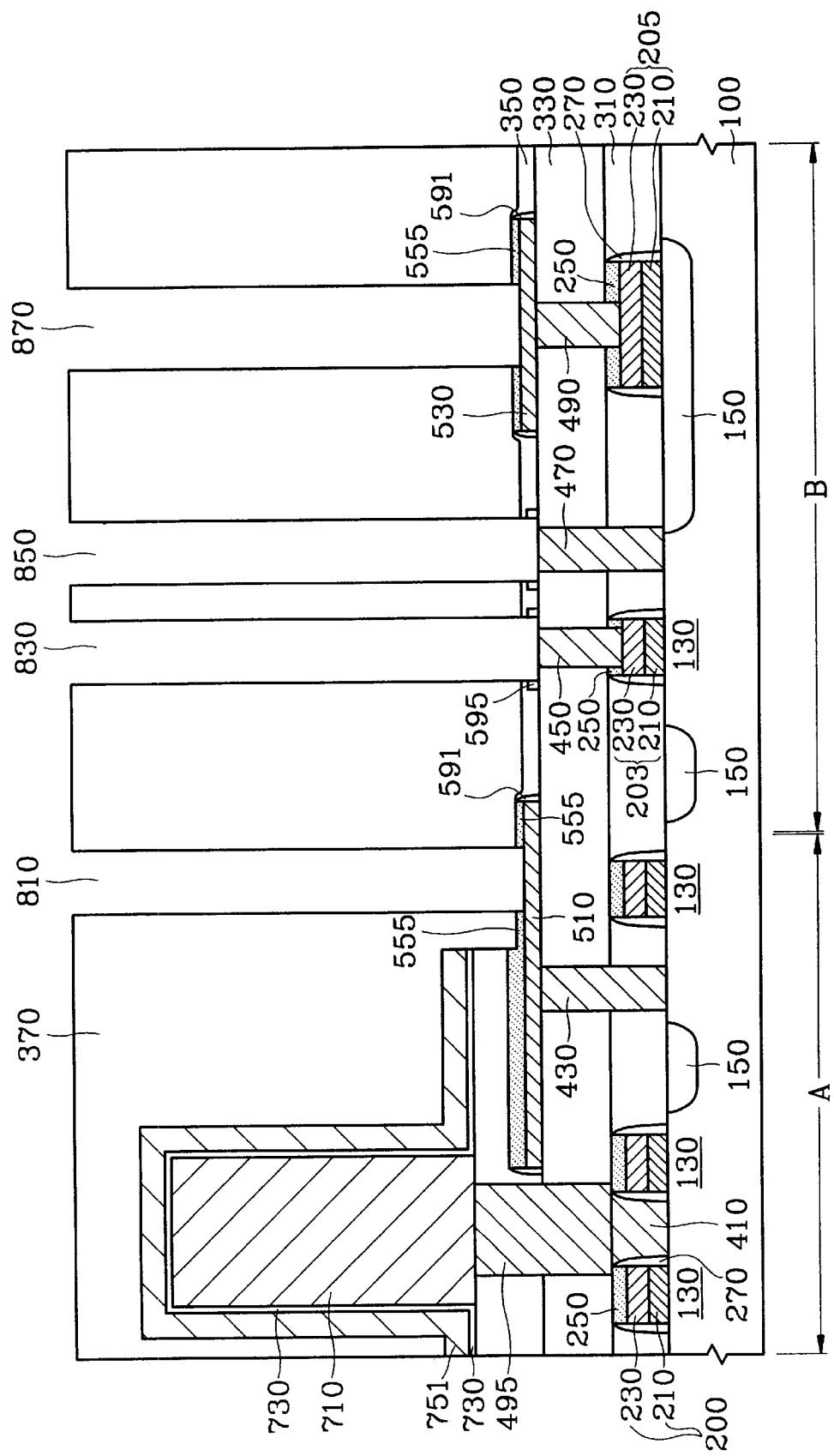

FIG. 8 schematically shows the step of removing the first and second etch stop patterns 595 and 555 exposed by the contact holes 810, 830, 850, and 870. More specifically, once the etch stop has been performed at the first and second etch stop patterns 595 and 555, an etching process continues to be performed. That is, the etching process may be performed to remove the first and second etch stop patterns 595 and 555 using overetching The first and second contact holes 810 and 830 expose the surfaces of the bit line 510 and the second conductive plug 450, respectively. The third and fourth contact holes 850 and 870 expose the surfaces of the third conductive plug 470 and the electrode 530.

In the first embodiment of the present invention, the thickness of the second capping insulating layer 550 is reduced such that the thickness of the second etch stop pattern 555 approximates that of the first etch stop pattern 595, profile defects of the contact holes 810, 830, 850, and 870 may be prevented by removal of the first and second etch stop patterns 595 and 555.

More specifically, in the case where the difference in thickness of the first and second etch stop patterns 595 and 555 exposed by the contact holes 810, 830, 850, and 870 is significantly large, the underlying second interlayer dielectric layer 330, which surrounds the second or third conductive plugs 450 or 470 may be vulnerable to excessive loss.

For example, if the second capping insulating layer 550, which has been previously formed on the bit line 510 or the electrode 530 for a SAC process, remains without the process of reducing the thickness thereof unlike in the first embodiment to be used in etch stop, the thickness of the second capping insulating layer 550 used as an etch stop point is left unchanged. For example, if the initial thickness of the second capping insulating layer 550 is about 2,000 Å, the thickness of the first etch stop pattern 595 is only about 400 Å and thus the second capping insulating layer 550 is about five times as thick as the first etch stop pattern 595.

In order for the first or fourth contact hole 810 or 870 to expose the bit line 510 or the electrode 530, the exposed second capping insulating layer 550 must be etched and removed. In this case, since the first etch stop pattern 595 has a thickness which is very smaller than the second capping insulating layer 550, the first etch stop pattern 595 all may be removed before the second capping insulating layer 550 has been removed. Thus, the second insulating layer 550 may remain rendering the contact holes 810 and 870 unopen.

If the etching process continues to be performed so as to open the contact holes 810 and 870, a portion of the second interlayer dielectric layer 330 surrounding the second or third conductive plug 450 or 470 begins to be consumed. This is because the second or third contact hole 830 or 850 exposes together the portion of the second interlayer dielectric layer 330 adjacent to the second or third conductive plug 450 or 470 due to misalignment margin. Thus, it is difficult to avoid the loss of the second interlayer dielectric layer 330, and if the second interlayer dielectric layer 330 is significantly consumed, the underlying other gate (not shown) is also exposed, which may lead to an undesired electrical short.

Also, the loss of the second interlayer dielectric layer 330 may result in defective profiles of the contact holes 810, 830, 850, and 870. Defects in profile may result in defects in filling the contact holes 810, 830, 850, and 870 with a conductive material. The filling defects may cause spiking in gap filling with a conductive material. Furthermore, the profile defects may prevent contact studs from vertically contacting the underlying conductive material such as the second or third conductive plug 450 or 470, thereby inhibiting free movement of electrons and increasing the contact resistance.

However, the first embodiment of the present invention involves forming the second etch stop pattern 555 by etching the second capping insulating layer 550 to reduce the thickness thereof, thus preventing the occurrences of the above defects. That is, the thickness of the second etch stop pattern 555 used as an etch stop point and the first etch stop pattern 595 is made similar thereby preventing the loss of the underlying second interlayer dielectric layer 330, which may be exposed due to a misalignment margin during an etching process for removing the first and second etch stop patterns 595 and 555, as much as possible. Furthermore, an etching amount by overetching for removing the first and second etch stop patterns 595 and 555 may be reduced to be as small as possible.

Figure 9:
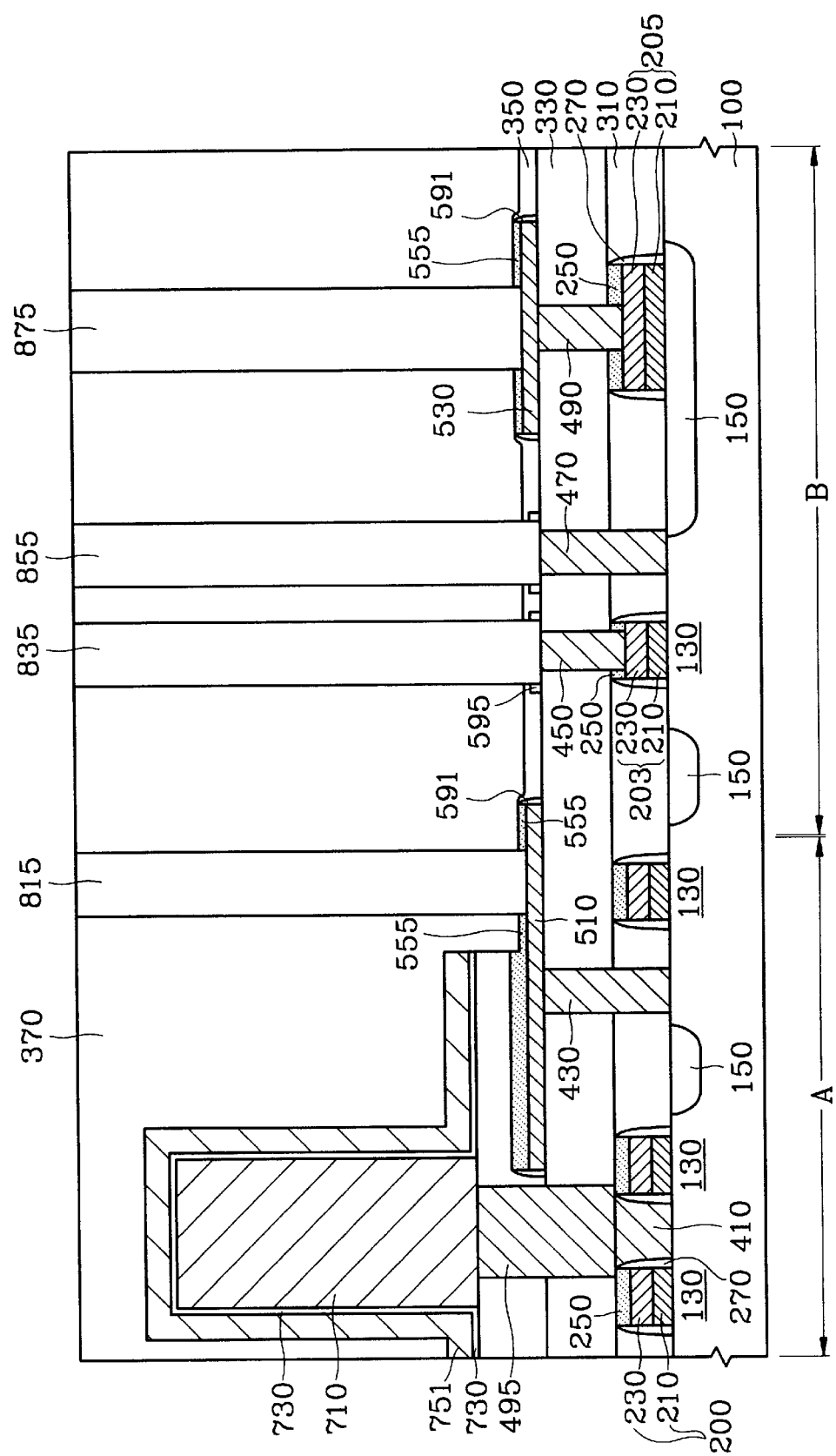

FIG. 9 schematically shows the step of simultaneously forming a plurality of conductive contact studs 815, 835, 855, and 875 for filling the contact holes 810, 830, 850, and 870. More specifically, a conductive layer for filling the contact holes 810, 830, 850, and 870 is formed over the fourth interlayer dielectric layer 370. In this case, since defects in profiles of the contact holes 810, 830, 850, and 870 are prevented as described above, the conductive layer can fill the contact holes 810, 830, 850, and 870 well. A metal layer such as Ti/TiN layer may be used as the conductive layer. Then, the conductive layer is planarized to form the plurality of contact studs 815, 835, 855, and 875.

FIGS. 10–13 are cross-sectional views schematically showing a method of manufacturing a semiconductor device including a plurality of contact studs according to a second embodiment of the present invention. Unlike the first embodiment of the present invention, the second embodiment of the present invention involves completely removing the second capping insulating layer 550 overlying the bit line 510 or the electrode 530 during a process of patterning the upper electrode 751 and forming another thin etch stop layer 590' instead. The same reference numerals as the first embodiment denote the same elements in the second embodiment.

Figure 10:
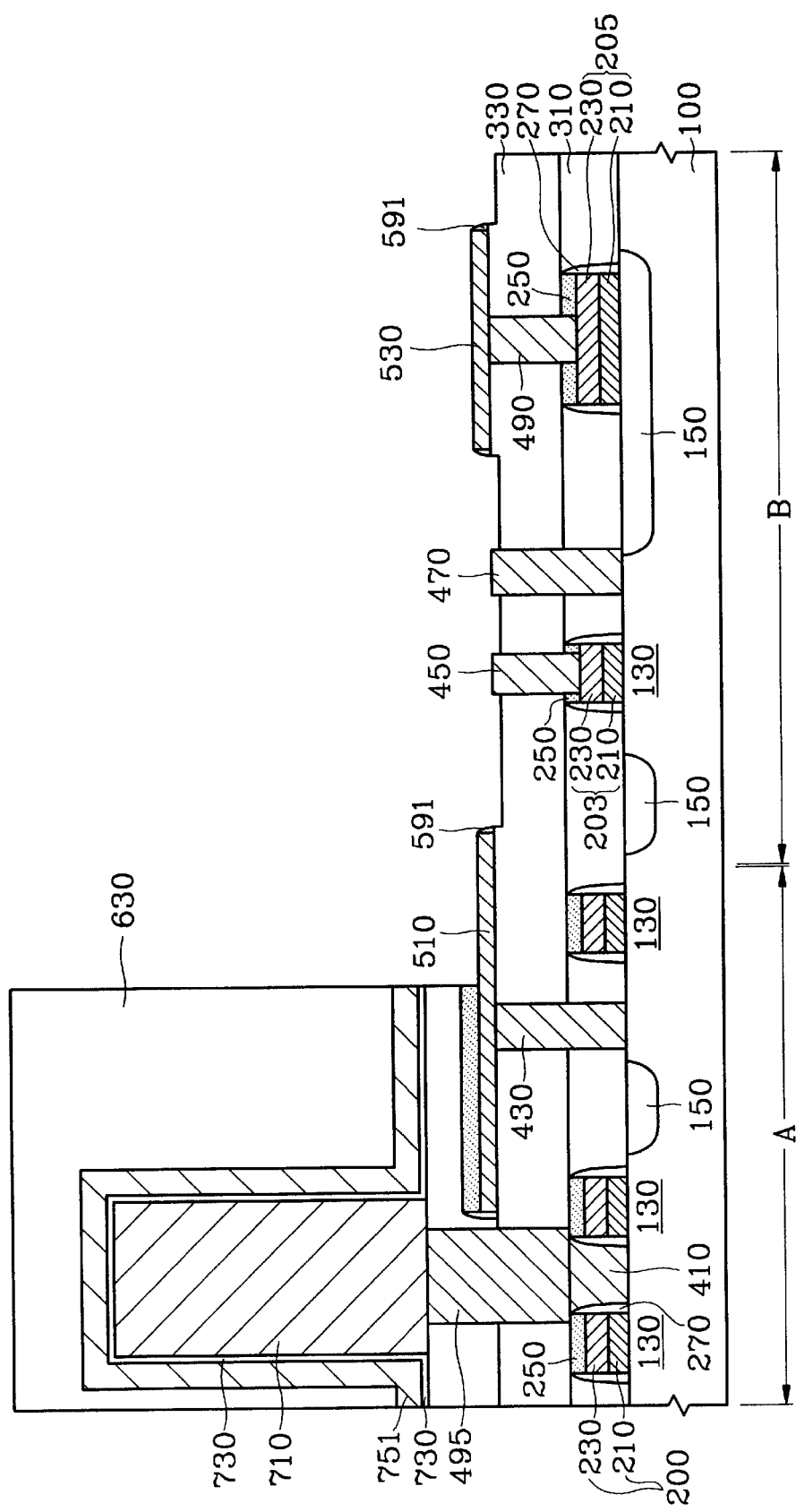

FIG. 10 schematically shows the step of patterning the upper electrode 751 and continuously etching and removing the exposed second capping insulating layer 550. More specifically, the multi-layered conductive patterns 210 and 230 and the plurality of gates 200, 203, and 205, each of which includes the conductive patterns 210 and 230 and accompanies a gate insulating layer (not shown), are formed on the semiconductor substrate 100 including the cell region A and the peripheral circuit region B. Each of the gates 200, 203, and 205 is formed on the active region 130, which is defined by an isolation layer 150, to form a transistor. The first capping insulating layer 250 is formed on top of the gate 200. In this case, the first capping insulating layer 250 is formed of an insulating material such as a silicon nitride layer having high selectivity to an insulating material layer used as an interlayer dielectric layer such as a silicon oxide layer. Also, the first spacers 270 are formed at the sidewalls of the gates 200, 203, and 205. The first spacer 270 is formed of an insulating material having high selectivity to an insulating material layer used as an interlayer dielectric layer.

After having formed the gates 200, 203, and 205, the first interlayer dielectric layer 310 overlies the gates 200, 203, and 205. The first interlayer dielectric layer 310 is penetrated to form the conductive pad 410 used as a BC pad by a SAC process. Then, the second interlayer dielectric layer 330 that overlies the conductive pad 410 is formed on the first interlayer dielectric layer 310. The second interlayer dielectric layer 330 and the underlying first interlayer dielectric layer 310 are penetrated to form the plurality of conductive plugs 430, 450, 470, and 490. The conductive plugs 430, 450, 470, and 490 may be formed of a conductive material such as Ti/TiN.

After having formed the conductive plugs 430, 450, 470, and 490, a conductive layer electrically connected to the first conductive plug 430 is deposited over the second interlayer dielectric layer 330 and patterned to form the bit line 510. The bit line 510 may be formed of a conductive material such as tungsten. In this case, the bit line 510 may be formed with a design rule of about 0.11 $\mu$m line width. A barrier metal layer (not shown) may underlie the bit line 510.

Together with the bit line 510, an electrode 530 electrically connected to the third gate 205 on the peripheral circuit region B may be formed. That is, the electrode 530 electrically connected to the fourth gate 205 on the peripheral circuit region B may be formed together during a process of forming the bit line 510. That is, the conductive layer deposited for forming the bit line 510 may be patterned together during a process of patterning the bit line 510, thereby using it as the electrode 530. The electrode 530 may be electrically connected to the third gate 205.

The second capping insulating layer 550 may be deposited on the bit line 510 and the electrode 530, and the second spacer 591 may be formed at the sidewall of the resulting material. The second spacer 591 may be formed by forming the second spacer layer (590 of FIG. 2) and then anisotropically etching the same. In this case, as shown in FIG. 3, the portions of the second spacer layer 590 overlying the second and third conductive plugs 450 and 470 may remain. However, in this embodiment, it is preferable to perform anisotropic etching on the second spacer layer 590 so that the surfaces of the second and third conductive plugs may be exposed. That is, the etch stop pattern (595 of FIG. 3) in the first embodiment may not be formed.

Then, the third interlayer dielectric layer 350 overlies the bit line 510, and the third interlayer dielectric layer 350 and the underlying second interlayer dielectric layer 330 are penetrated to form the BC plug 495 electrically connected to the conductive pad 410 which is the BC pad. Then, the lower electrode 710 of a capacitor electrically connected to the BC plug 495 and the underlying cell transistor is formed of a conductive material.

A dielectric material is deposited on the lower electrode 710, on top of which the upper electrode layer 750 is formed. The upper electrode layer 750 may be formed of various conductive materials such as a conductive polycrystalline silicon layer. Then, a second etch mask to be used in photolithography for patterning the upper electrode layer 750, such as the second photoresist pattern 630, is formed. Since the upper electrode layer 750 also extends to the semiconductor substrate 100 on the peripheral circuit region B, the second photoresist pattern 630 may expose the peripheral circuit region B so as to selectively remove a portion of the upper electrode layer 750 on the peripheral circuit region B.

The portion of the upper electrode layer 750 exposed by the second photoresist pattern 630 is selectively removed thereby forming the patterned upper electrode 751. In this case, the upper electrode 751 may be patterned by an etching process having a design rule of a line width of about 0.13 $\mu$m. The etching is performed so as to continuously etch and pattern the dielectric layer 730 underlying the upper electrode layer 750. Also, a partial thickness of the underlying third interlayer dielectric layer 350 exposed by the dielectric layer 730 patterned by this etching also may be recessed.

After having patterned the upper electrode 751, the exposed third interlayer dielectric layer 350 continues to be etched. In this case, the third interlayer dielectric layer 350 may continue to be etched under etching conditions different from those used in patterning the upper electrode 751. For example, the third interlayer dielectric layer 350 continues to be etched under an etching condition that the etching rate of the second capping insulating layer 550 is similar to or higher than the etching rate of the third interlayer dielectric layer 350.

For example, an etch gas containing CHF$_3$ gas, to which O$_2$ gas, Ar gas, or CF$_4$ gas may be added, may be used in etching the upper electrode 751, but an etch gas containing CH$_2$F$_2$ as a main gas can be used in etching the third interlayer dielectric layer 350 and the second capping insulating layer 550. In this case, O$_2$ gas, Ar gas, or CF$_4$ gas may be added to the etch gas.

The etching continues to proceed after the surface of the second capping insulating layer 550 underlying the third interlayer dielectric layer 350 is exposed, thereby etching the exposed second capping insulating layer 550 and thus reducing the thickness thereof. In this case, the etch gas which contains CH$_2$F$_2$ gas as a main gas as described above can achieve selectivity of silicon nitride to silicon oxide preferably greater than 2:1.

In this case, a process of etching portions of the third interlayer dielectric layer 350 and the second capping insulating layer 550 exposed by the patterned upper electrode 751 may be performed at least until the exposed portion of the second capping insulating layer 550 is completely removed to expose the top surface of the underlying bit line 510 or the electrode 530. Thus, the second interlayer dielectric layer 330 is recessed by a certain thickness, and the top surface of the second and third conductive plugs 450 and 470 may be exposed.

The second capping insulating layer 550 on a portion of the bit line 510 and the electrode 530 can be selectively removed by etching as described above.

Figure 11:
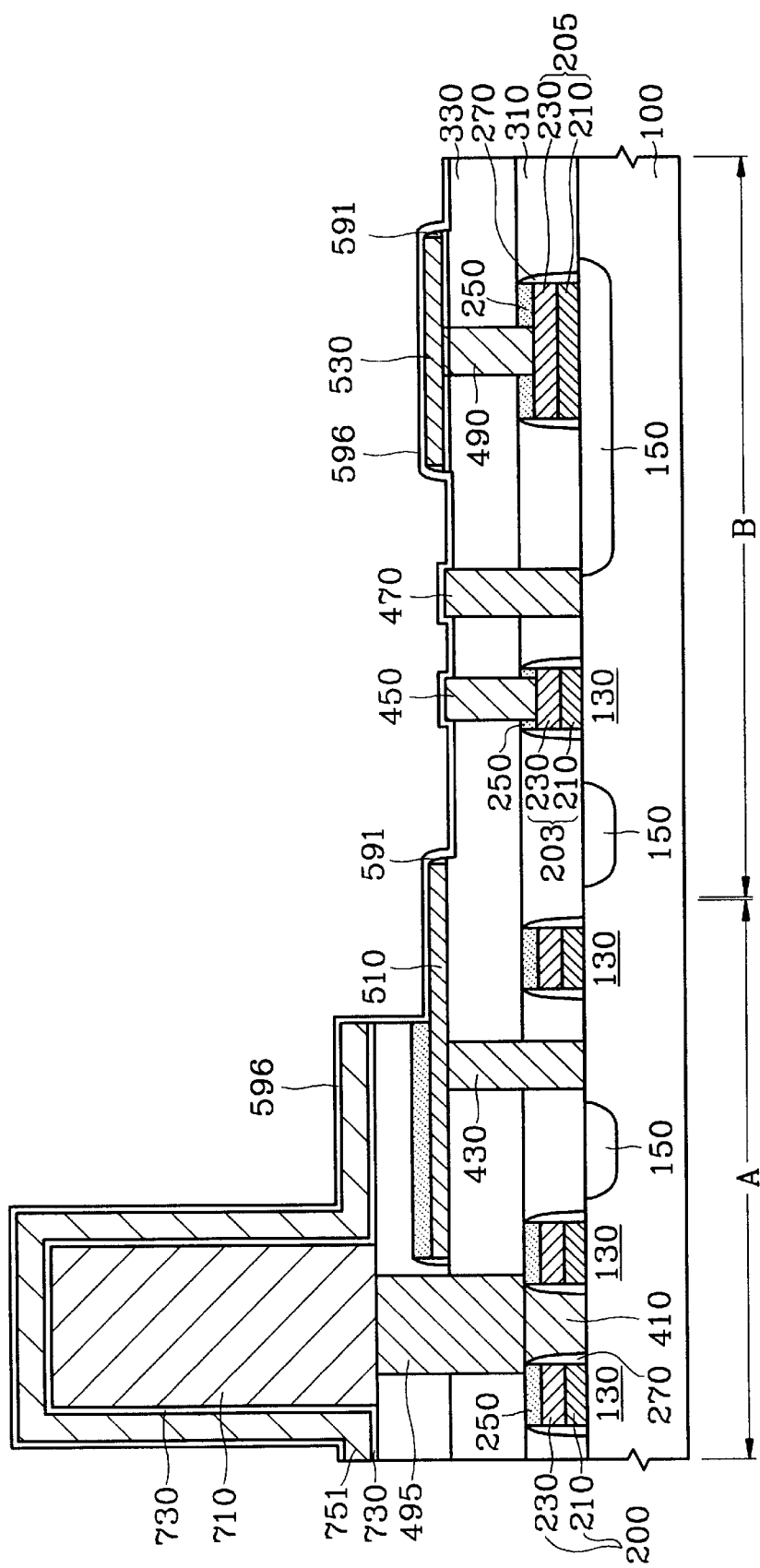

FIG. 11 schematically shows the step of forming an etch stop layer 590 on the bit line 510 and the electrode 530 for a gate. More specifically, after having exposed a portion of bit line 510 and the top surface of the electrode 530, the etch stop layer 596 overlies the second and third conductive plugs 450 and 470. The etch stop layer 596 extends so as to cover the exposed top surfaces of the bit line 510 and the electrode 530.

The etch stop layer 596 is provided to be used as an etch stop point during a subsequent process, that is an etching process for forming a plurality of contact holes for metal contact studs. Thus, the etch stop layer may be formed of an insulating material having high selectivity to silicon oxide preferably forming a fourth interlayer dielectric layer which will be later formed, such as silicon nitride, aluminum oxide ($Al_2O_3$) or silicon carbide (SiC). In this case, the etch stop layer 596 may be formed to an appropriate thickness required for performing an etch stop function, e.g., about 400 Å.

Figure 12:
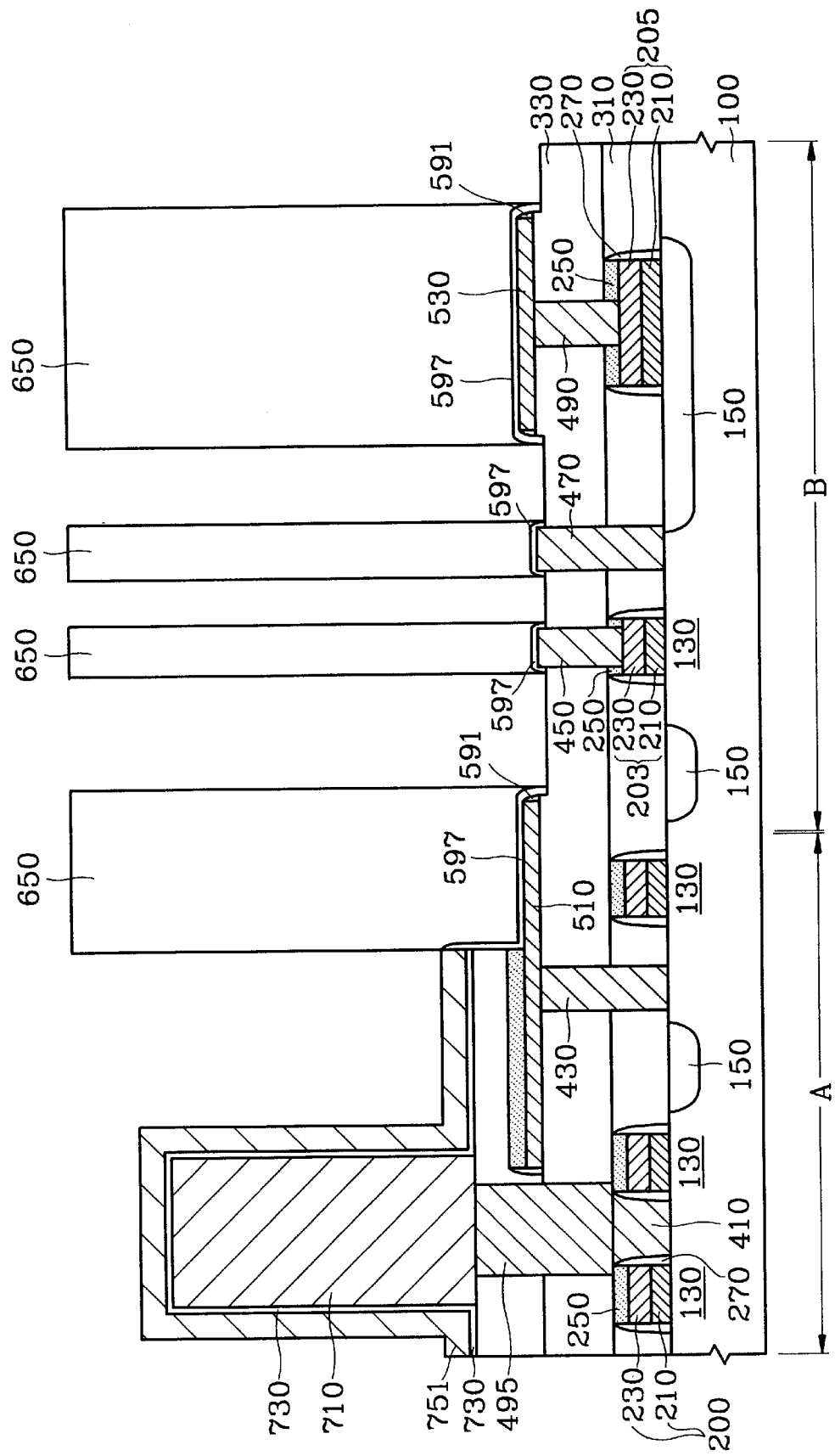

FIG. 12 schematically shows the step of forming an etch stop pattern 597. Specifically, the etch stop layer 596 is patterned using a third photoresist pattern 650 that covers portions of the etch stop layer 596 overlying a portion of the bit line 510 exposed by removing a portion of the second capping insulating layer 550 and the electrode 530 and the second and third conductive plugs 450 and 470.

The etch stop patterns 597 having substantially the same thickness by this patterning process are formed. The etch stop patterns 597 that overlie the bit line 510, the electrode 530, and the second and third conductive plug 450 and 470 have substantially the same thickness because they are patterned from substantially the same layer.

FIG. 13 schematically shows the step of forming the plurality of contact holes 810, 830, 850, and 870 after forming the fourth interlayer dielectric layer 370 overlying the upper electrode 751. Specifically, the fourth interlayer dielectric layer 370 overlies the upper electrode 751 and the etch stop pattern 597. In this case, the fourth interlayer dielectric layer 370 is formed to a thickness sufficient to overcome the step difference between the cell region A and the peripheral circuit region B due to the height of a cell capacitor. Also, the fourth interlayer dielectric layer 370 may be formed of a silicon oxide layer.

The fourth interlayer dielectric layer 370 is selectively etched using photolithography to form the plurality of contact holes 810, 830, 850, and 870 at various positions. For example, a first contact hole 810 aligned on a portion of the bit line 510 extending to the peripheral circuit region B may be formed. In this case, since the fourth interlayer dielectric layer 370 is preferably formed of a silicon oxide layer, the above etching process may be performed under etching conditions for silicon oxide, which are well known. As the fourth interlayer dielectric layer 370 etches away, the exposed portions of the third interlayer dielectric layer 350, which remains on the etch stop patterns 597, may also be selectively etched.

In this case, the etching process for forming the first contact hole 810 may be terminated at the etch stop patterns 597 formed so as to overlie the bit line 510, the electrode 530, and the second and third conductive plugs 450 and 470, respectively, or substantially at the etch stop pattern 597 overlying the second or third conductive plugs 450 or 470. The etch stop is performed by selectivity achieved between silicon oxide constituting the fourth interlayer dielectric layer 370 and silicon nitride, silicon carbide, or aluminum oxide constituting the etch stop pattern 597.

Once the etch stop has been performed on the etch stop pattern 595, an etching process continues to be performed. That is, the etching process is performed to remove the etch stop patterns 597 using overetching. In this case, since the etch stop patterns 597 have substantially the same thickness, the etch stop patterns 597 can be completely removed by overetching while preventing an excessive loss of the second interlayer dielectric layer 330 adjacent to the second or third conductive plug 450 or 470. Thus, the plurality of contact holes 810, 830, 80, and 870 may have good profiles with one etching process.

For a subsequent process, a conductive layer for filling the contact holes 810, 830, 850, and 870 is deposited and patterned to form a plurality of conductive contact studs at the same time. The conductive contact studs may be formed of a metal layer such as Ti/TiN layer.

The present invention allows various metal contact studs, introduced for electrically connecting wiring lines with the underlying semiconductor substrate, the gate, the bit line, and the electrode connected to the gate, to be formed with the same fabrication step. Various metal contact studs are formed so as to fill the contact holes formed on the interlayer dielectric layer deposited after the process of forming the capacitor. An etching process for forming the contact holes may be terminated on the etch stop layer formed on the bit line or electrode or on the etch stop layer formed on a conductive plug electrically connected to the gate or semiconductor substrate.

In this case, the present invention makes the thickness of the etch stop layer formed on the bit line or the electrode and the etch stop layer formed on the conductive plug similar, thereby preventing an excessive loss of the underlying interlayer dielectric layer adjacent to the top surface of the conductive plug by etching for removing the etch stop layers. Accordingly, the present invention allows for formation of contact holes having excellent profiles thus preventing the occurrences of defects such as defects in filling with conductive contact studs or an increase of contact resistance. Furthermore, an electrical short due to the excessive loss of the underlying interlayer dielectric layer can be prevented.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A method of manufacturing a semiconductor device comprising:
   forming a first interlayer dielectric layer which surrounds and insulates a plurality of conductive plugs formed on a semiconductor substrate and exposes the top surfaces of the plurality of conductive plugs;
   forming a bit line electrically connected to a first conductive plug of the plurality of conductive plugs, wherein the bit line includes a spacer on a sidewall thereof, a capping insulating layer at one portion of the top surface of the bit line, and a first etch stop pattern having a thickness smaller than the capping insulating layer at another portion of the top surface of the bit line;

forming a second etch stop pattern which covers the surface of a second conductive plug of the plurality of conductive plugs;

forming a second interlayer dielectric layer that overlies the capping insulating layer and the first and second etch stop patterns;

etching the second interlayer dielectric layer using the first and second etch stop patterns as an etch stop point and forming a plurality of contact holes aligned to the bit line and the second conductive plug, respectively;

etching portions of the first and second etch stop pattens exposed by the plurality of contact holes and exposing the top surfaces of the bit line and the second conductive plug; and forming a plurality of conductive contact studs electrically connected to the bit line and the second conductive plug, respectively, by filling the plurality of contact holes.

2. The method of claim 1, wherein the second conductive plug is electrically connected to the semiconductor substrate.

3. The method of claim 1, wherein the second conductive plug is electrically connected to a gate formed on the semiconductor substrate.

4. The method of claim 1, further comprising:
while forming the bit line, forming an electrode connected to a third conductive plug of the plurality of conductive plugs;
forming a third etch stop pattern on top of the electrode; and
forming a spacer along a sidewall of the electrode.

5. The method of claim 1, wherein the first etch stop pattern is formed of at least one of silicon nitride, silicon carbide, and aluminum oxide.

6. The method of claim 1, wherein the second etch stop pattern is formed of at least one of silicon nitride, silicon carbide, and aluminum oxide.

7. The method of claim 1, wherein the difference in thickness of the first and second etch stop patterns is less than 100 Å.

8. The method of claim 1, wherein the first etch stop pattern is formed by forming the capping insulating layer extending to a portion where the first etch stop pattern is positioned and by selectively etching the capping insulating layer and reducing the thickness thereof.

9. The method of claim 8, further comprising:
forming a third interlayer dielectric layer overlying the capping insulating layer under the second interlayer dielectric layer;
forming a lower electrode of a capacitor, a dielectric layer, and an upper electrode layer on the third interlayer dielectric layer so as to underlie the second interlayer dielectric layer; and
patterning the upper electrode layer to form an upper electrode;
wherein the first etch stop pattern is formed by continuously etching the third interlayer dielectric layer exposed after having patterned the upper electrode layer and etching a portion of the capping insulating layer exposed by etching the third interlayer dielectric layer.

10. The method of claim 8, wherein the second etch stop pattern is formed by patterning a spacer layer deposited on the bit line so as to form the spacer.

11. The method of claim 1, wherein the first and second etch stop patterns are formed by:

selectively removing the portion of the capping insulating layer overlying the portion where the first etch stop pattern will be formed and selectively exposing the top surface of the bit line while exposing the top surface of the second conductive plug;

forming an etch stop layer overlying the exposed top surfaces of the bit line and the second conductive plug; and patterning the etch stop layer.

12. The method of claim 11, further comprising:
forming a third interlayer dielectric layer overlying the capping insulating layer under the second interlayer dielectric layer;
forming a lower electrode of a capacitor, a dielectric layer, and an upper electrode layer on the third interlayer dielectric layer so as to underlie the second interlayer dielectric layer; and
patterning the upper electrode layer to form an upper electrode;
wherein exposing the top surface of the second interlayer dielectric layer comprises:
continuously etching the second interlayer dielectric layer exposed after having patterned the upper electrode layer;
etching a portion of the capping insulating layer exposed by etching the third interlayer dielectric layer and exposing the top surface of the underlying bit line; and
continuously etching the third interlayer insulating layer using the exposed bit line as an etch mask.

13. A method of manufacturing a semiconductor device comprising:
forming a first interlayer dielectric layer which surrounds and insulates a plurality of conductive plugs formed on a semiconductor substrate and exposes the top surfaces of the plurality of conductive plugs;
sequentially forming a conductive layer and a capping insulating layer on the first interlayer dielectric layer;
sequentially patterning the capping insulating layer and the conductive layer to form a bit line electrically connected to a first conductive plug of the plurality of conductive plugs while exposing the top surface of a second conductive plug of the plurality of conductive plugs;
forming a spacer layer that overlies the bit line and the exposed second conductive plug;
forming an etch mask that covers at least the portion of the spacer layer overlying the second conductive plug;
etching the spacer layer exposed by the etch mask to from a spacer that covers the sidewall of the bit line while forming a first etch stop pattern overlying at least the top surface of the second conductive plug;
forming a second interlayer dielectric layer that overlies the capping insulating layer remaining on the top surface of the bit line and the first etch stop pattern;
forming a lower electrode of a capacitor, a dielectric layer, and an upper electrode layer on the second interlayer dielectric layer;
selectively etching the upper electrode layer to form an upper electrode;
continuously etching the underlying remaining capping insulating layer to reduce the thickness of the capping insulating layer thereby forming a second etch stop pattern;

forming a third interlayer dielectric layer that overlies the first and second etch stop patterns and the upper electrode;

etching the third interlayer dielectric layer using the first and second etch stop patterns as an etch stop point to form a plurality of contact holes aligned with the bit line and the second conductive plug;

etching portions of the first and second etch stop patterns exposed by the plurality of contact holes to expose the top surfaces of the bit line and the second conductive plug, respectively; and forming a plurality of conductive contact studs electrically connected to the bit line and the second conductive plug, respectively, by filling the plurality of contact holes.

14. The method of claim 13, wherein the first etch stop pattern is formed of at least one of silicon nitride, silicon carbide, and aluminum oxide.

15. The method of claim 13, wherein the second etch stop pattern is formed of at least one of silicon nitride, silicon carbide, and aluminum oxide.

16. The method of claim 13, wherein the difference in thickness of the first and second etch stop pattens is less than 100 Å.

17. The method of claim 13, further comprising:

while forming the bit line, sequentially patterning the capping insulating layer and the conductive layer and forming the electrode electrically connected to a third conductive plug of the plurality of conductive plugs; and while forming the second etch stop pattern on the bit line, forming the second etch stop pattern on the electrode by reducing the thickness of the capping insulating layer that remains on the top surface of the electrode; wherein one of the plurality of contact holes is aligned to the electrode.

18. A method of manufacturing a semiconductor device comprising:

forming a first interlayer dielectric layer which surrounds and insulates a plurality of conductive plugs formed on a semiconductor substrate and exposes the top surfaces of the plurality of conductive plugs;

sequentially forming a conductive layer and a capping insulating layer on the first interlayer dielectric layer;

sequentially patterning the capping insulating layer and the conductive layer to form a bit line electrically connected to a first conductive plug of the plurality of conductive plugs while exposing the top surface of a second conductive of the plurality of conductive plugs;

forming a spacer that covers the sidewall of the bit line;

forming a second interlayer dielectric layer that overlies the capping insulating layer remaining on the top surface of the bit line and the second conductive plug;

forming a lower electrode of a capacitor, a dielectric layer, and an upper electrode layer on the second interlayer dielectric layer;

selectively etching the upper electrode layer to form an upper electrode;

continuously etching the underlying remaining capping insulating layer to expose a portion of the top surface of the bit line and the top surface of the second conductive plug;

forming an etch stop pattern that overlies at least the exposed top surfaces of the second conductive plug and the bit line;

forming a third interlayer dielectric layer that overlies the etch stop pattern and the upper electrode;

etching the third interlayer dielectric layer using the etch stop pattern as an etch stop point to form a plurality of contact holes aligned with the bit line and the second conductive plug;

etching portions of the first and second etch stop patterns exposed by the plurality of contact holes and exposing the top surfaces of the bit line and the second conductive plug, respectively; and forming a plurality of conductive contact studs electrically connected to the bit line and the second conductive plug, respectively, by filling the plurality of contact holes.

19. The method of claim 18, wherein the etch stop layer is formed of at least one of silicon nitride, silicon carbide, and aluminum oxide.

20. The method of claim 18, further comprising:

while forming the bit line, sequentially patterning the capping insulating layer and the conductive layer and forming the electrode electrically connected to a third conductive plug of the plurality of conductive plugs; and while continuously etching the capping insulating layer, etching and removing the capping insulating layer remaining on the top surface of the electrode; wherein:

the etch stop pattern is formed on the electrode exposed by removing the capping insulating layer;

one of the plurality of contact holes is aligned to the electrode.

* * * * *